(12) United States Patent
Philipp et al.

(10) Patent No.: US 8,054,090 B2
(45) Date of Patent: Nov. 8, 2011

(54) NOISE HANDLING IN CAPACITIVE TOUCH SENSORS

(75) Inventors: Harald Philipp, Southampton (GB); Daniel Pickett, Southampton (GB); Esat Yilmaz, Southampton (GB)

(73) Assignee: Atmel Corporation, San Jose, CA (US)

( * ) Notice: Subject to any disclaimer, the term of this patent is extended or adjusted under 35 U.S.C. 154(b) by 445 days.

(21) Appl. No.: 12/255,998

(22) Filed: Oct. 22, 2008

(65) Prior Publication Data

US 2010/0097078 A1    Apr. 22, 2010

(51) Int. Cl.
*G01R 27/26* (2006.01)
(52) U.S. Cl. ........................................ 324/684; 324/678
(58) Field of Classification Search .................. 324/684, 324/678
See application file for complete search history.

(56) References Cited

U.S. PATENT DOCUMENTS

| | | |
|---|---|---|
| 6,452,514 B1 | 9/2002 | Philipp |
| 7,663,607 B2 | 2/2010 | Hotelling |
| 7,920,129 B2 | 4/2011 | Hotelling |
| 2002/0186210 A1 | 12/2002 | Itoh |
| 2005/0099188 A1* | 5/2005 | Baxter .......................... 324/678 |

FOREIGN PATENT DOCUMENTS

WO    00/44018 A1    7/2000

OTHER PUBLICATIONS

"International Application Serial No. PCT/US2009/061543, Search Report mailed Jan. 7, 2010", 3 pgs.
"International Application Serial No. PCT/US2009/061543, Written Opinion mailed Jan. 7, 2010", 4 pgs.

* cited by examiner

*Primary Examiner* — Vincent Q Nguyen
(74) *Attorney, Agent, or Firm* — Baker Botts L.L.P.

(57) ABSTRACT

In a capacitive sensor of the type having X electrodes which are driven and Y electrodes that are used as sense channels connected to charge measurement capacitors, signal measurements are made conventionally by driving the X electrodes to transfer successive packets of charge to the charge measurement capacitors. However, an additional noise measurement is made by emulating or mimicking the signal measurement, but without driving the X electrodes. The packets of charge transferred to the charge accumulation capacitor are then indicative of noise induced on the XY sensing nodes. These noise measurements can be used to configure post-processing of the signal measurements.

18 Claims, 6 Drawing Sheets

NOISE HANDLING IN CAPACITIVE TOUCH SENSORS

BACKGROUND OF THE INVENTION

The present invention relates to noise handling in a capacitive touch sensor for detecting proximity of a body, more especially to a capacitive sensor of the so-called active type which is based on measuring the capacitive coupling between a drive and a sense electrode.

There are various forms of touch sensitive controls which use a capacitive sensor to sense the presence of a body such as a user's finger. A form of touch sensitive control is disclosed in WO-00/44018. In this example a pair of electrodes are provided which act as a key so that the presence of a body such as a user's finger is detected as a result of a change in an amount of charge which is transferred between the two electrodes. With this arrangement, one of the electrodes (labeled X) is driven with a drive circuit and the other of the pair of electrodes (labeled Y) is connected to a charge measurement circuit which detects an amount of charge present on the Y plate when driven by the X plate. As disclosed in WO-00/44018 several pairs of electrodes can be arranged to form a matrix of sensing areas which can provide an efficient implementation of a touch sensitive two-dimensional position sensor. Such two dimensional capacitive transducing (2DCT) sensors are typically used with devices which include touch sensitive screens or touch sensitive keyboards/keypads which are used in for example in consumer electronic devices and domestic appliances.

Devices employing 2DCT sensors have become increasingly popular and common not only in conjunction with personal computers but also in all manner of other appliances such as personal digital assistants (PDAs), point of sale (POS) terminals, electronic information and ticketing kiosks, kitchen appliances and the like. 2DCT sensors are frequently preferred to mechanical switches for a number of reasons. For example, 2DCT sensors require no moving parts and so are less prone to wear than their mechanical counterparts. 2DCT sensors can also be made in relatively small sizes so that correspondingly small, and tightly packed keypad arrays can be provided. Furthermore, 2DCT sensors can be provided beneath an environmentally sealed outer surface/cover panel. This makes their use in wet environments or where there is a danger of dirt or fluids entering a device being controlled attractive. In addition, manufactures often prefer to employ interfaces based on 2DCT sensors in their products because such interfaces are often considered by consumers to be more aesthetically pleasing than conventional mechanical input mechanisms (e.g. push-buttons).

Other devices which may incorporate 2DCT sensors include pen-input tablets and encoders used in machinery for feedback control purposes, for example 2DCT sensors are capable of reporting at least a 2-dimensional coordinate, Cartesian or otherwise, related to the location of an object or human body part by means of a capacitance sensing mechanism.

Although touch sensitive capacitive sensors such as those described above and disclosed in the above-mentioned disclosures have been successfully deployed in many applications, some applications can present a challenging environment for detecting a change in charge as a result of the presence of a body.

For example, the use of a touch sensor on a mobile phone can create a technical problem because there is a variety of disturbing noise signals produced by radio frequency radiation by radio frequency signals and by modulators within the mobile phone. Similarly, a liquid crystal display (LCD) has characteristic switching noise as a result of switching and refreshing pixels. Other types of display may have their own forms of characteristic impulsive noise related to pixel scanning and refresh. Sinusoidal noise, such as that produced by mains electricity may also be present, which can affect the amount of charge detected on a key. This may be significant, for example, when a hand held device such as a mobile telephone is being charged through the mains.

FIG. 7 of the accompanying drawings shows an example of sinusoidal noise in the form of a plot of signal strength or amplitude which may be voltage or charge measured with respect to time. Various points 220 are shown to indicate points at which burst measurements are taken for a touch sensor such as those described above. As will be appreciated, as a result of sinusoidal noise represented by a line 222, an amount of charge transferred from a key by a measurement capacitor of the measurement circuit such as those described above will vary and therefore could in some circumstances cause a false measurement of the presence of a body.

FIG. 8 of the accompanying drawings shows another form of noise, namely rectangular or impulsive noise, i.e. noise having high frequency components, such as that which might be produced by switching the pixels in a LCD display with which the touch panel is integrated. A plot of signal strength with respect to time is shown with sampling points 220, which might be produced by bursts of measurement cycles in a measurement circuit such as those described above. Noise impulses 222 are also shown. If a measurement cycle coincides with a rising edge of a noise impulse, as may arise from an LCD switching event, then an erroneous measurement can be produced which can again cause a touch sensor to erroneously detect the presence of a body.

FIG. 9 of the accompanying drawings illustrates this situation showing simultaneous sinusoidal and rectangular noise. As will be appreciated, in general, both sinusoidal noise and rectangular noise may be present during a given time period. Moreover, by its nature, the amount of noise as well as its frequency components will often vary over time.

Prior art capacitive sensors adopt a variety of signal processing techniques to filter noise from the acquired signals. For example, boxcar averagers and detection integrators have been used in the past. In principle other types of standard filtering could be used, and may have been used, such as slew rate filters, high frequency pass filters, low frequency pass filters and band pass filters.

It is desirable to tailor the filtering depending on how noisy the signals are. For example, it may be desirable to switch certain filters on and off depending on the amount and characteristics of noise, or to set parameters of filters having regard to the noise.

SUMMARY OF THE INVENTION

The invention provides a method of measuring proximity of a body to a capacitive sensor device comprising a coupling capacitor having a capacitance sensitive to proximity of a body, and a charge accumulation capacitor having first and second plates, the first plate being connected to the coupling capacitor, and the second plate being connected to a voltage output line.

A signal measurement is made conventionally by transferring charge indicative of the capacitance of the coupling capacitor from the coupling capacitor to the charge accumulation capacitor, and by reading the voltage on the voltage output line, thereby to measure proximity of a body.

An additional noise measurement is made, either before or after the signal measurement, by emulating or mimicking the signal measurement, but inhibiting charge from arising on the coupling capacitor as a result of proximity of a body, thereby to transfer charge indicative of noise induced on the coupling capacitor to the charge accumulation capacitor, and by reading the voltage on the voltage output line, thereby to measure noise.

In a preferred embodiment, a method of measuring proximity of a body to a capacitive sensor device is provided, the capacitive sensor device comprising X and Y electrodes forming respective X and Y plates of a coupling capacitor having a capacitance sensitive to proximity of a body, and a charge accumulation capacitor having first and second plates, the first plate being connected to the Y plate of the coupling capacitor, and the second plate being connected to a voltage output line, the method comprising: making a signal measurement by applying one or more cycles of driving the X electrode with an input voltage, thereby to transfer one or more packets of charge indicative of the capacitance of the coupling capacitor from the coupling capacitor to the charge accumulation capacitor, and by reading the voltage on the voltage output line, thereby to measure proximity of a body; and making a noise measurement, either before or after the signal measurement, by emulating or mimicking the signal measurement, but without driving the X electrode, thereby to transfer one or more packets of charge indicative of noise induced on the coupling capacitor to the charge accumulation capacitor, and by reading the voltage on the voltage output line, thereby to measure noise.

A noise measurement can therefore be obtained whenever desired, for example after every 'n' signal measurements, wherein the noise measurement is taken directly from the coupling capacitors that form the sensing nodes of the capacitive sensor device. The noise measurements should therefore be representative of noise levels when the signal measurements are made, since they are obtained using the same circuit elements and interconnects. Moreover, the noise measurements can be made without any additional hardware requirement on the sensor device.

The second plate of the charge accumulation capacitor is preferably connected to a pre-charge line operable to inject a predetermined amount of charge onto the second plate When making the noise measurement, the second plate of the charge accumulation capacitor is then charged before mimicking the signal measurement, thereby to measure noise through its modulation of the amount of charge initially placed on the charge accumulation capacitor. The pre-charge makes the amount of charge accumulated on the charge accumulation capacitor independent of the sign of the charge induced on the Y plate of the coupling capacitor at each cycle of the noise measurement process. This is useful if the controller is not capable of measuring arbitrary voltages from the charge accumulation capacitor. For example, if the controller does not use an analog to digital converter to read off the voltage, but rather a comparator only capable of detecting zero crossings, then the second plate of the charge accumulation capacitor can be pre-charged, e.g. to a certain negative or positive voltage, to ensure that noise contributions will not cause the voltage to change sign before read out, but rather only modulate the pre-charge voltage without changing its sign.

In the noise measurement, charge may be transferred to the charge accumulation capacitor in a plurality of cycles, and the voltage on the voltage output line is read after a predetermined number of said cycles. In order that the noise is not averaged out on the charge accumulation capacitor, the number of cycles is preferably 1, or a small integer number such as 2, 3, 4 or 5.

In the signal measurement, charge may be transferred to the charge accumulation capacitor in a plurality of cycles, and the voltage on the voltage output line is read after a predetermined number of said cycles. Alternatively, charge may be transferred to the charge accumulation capacitor in a plurality of cycles, wherein the cycles are repeated until the voltage on the voltage output line reaches a threshold value, the number of cycles required to reach the threshold value being read as the measure of the capacitance. In the signal measurement, the number of predetermined cycles could be 1, but is preferably a higher number so that the charge accumulation capacitor has an averaging effect on any noise. For example, the number of cycles is preferably at least 5, 10, 20, 30, 40, 50 or 100. The number of cycles over which charge is transferred from the coupling capacitor to the charge accumulation capacitor is often referred to in the art as the burst length.

It will thus be appreciated that the noise measurement will typically use short fixed burst lengths, e.g. of only cycle or a few cycles, whereas the signal measurement will typically use longer burst lengths, which may be fixed, i.e. predetermined in number, or variable, i.e. the number required for the signal to reach a threshold value. Consequently the burst length for the noise measurement will typically be shorter than the burst length for the signal measurement.

The method is applied by interspersing signal measurements and noise measurements. Typically, a plurality of signal measurements are made for each noise measurement. The noise measurements may be limited so that they only occupy a certain minority of the total measurement time, for example a noise measurement may be made after 'n' signal measurements, where n might be at least 2, 3, 4, 5, 10, 20, 50 or 100. In a 2DCT, a noise measurement might be made once per frame or once every 'n' frames, where collection of a frame of touch data is defined as reading a signal measurement from each of the sensing nodes, i.e. each of the coupling capacitors, of the two-dimensional touch panel.

The invention also provides a capacitive sensor device comprising a coupling capacitor having a capacitance sensitive to proximity of a body, and a charge accumulation capacitor having first and second plates, the first plate being connected to the coupling capacitor, and the second plate being connected to a voltage output line, the device being operable in a first mode to make a signal measurement by transferring charge indicative of the capacitance of the coupling capacitor from the coupling capacitor to the charge accumulation capacitor, wherein the voltage on the voltage output line is a measure of proximity of a body; and the device being operable in a second mode to make a noise measurement by mimicking the signal measurement, but without enabling charge to arise on the coupling capacitor through proximity of a body, thereby to transfer charge indicative of noise induced on the coupling capacitor to the charge accumulation capacitor, wherein the voltage on the voltage output line is a measure of noise.

In a preferred embodiment the invention further provides a capacitive sensor device comprising X and Y electrodes forming respective X and Y plates of a coupling capacitor having a capacitance sensitive to proximity of a body, and a charge accumulation capacitor having first and second plates, the first plate being connected to the Y plate of the coupling capacitor, and the second plate being connected to a voltage output line, the device being operable in a first mode to make a signal measurement by applying successive cycles of driving the X electrode with an input voltage, thereby to transfer successive packets of charge indicative of the capacitance of the coupling capacitor from the coupling capacitor to the charge accumulation capacitor, wherein the voltage on the voltage output line is a measure of proximity of a body; and the device being operable in a second mode to make a noise measurement by mimicking the signal measurement, but without driving the X electrode, thereby to transfer successive packets of charge indicative of noise induced on the coupling capacitor to the charge accumulation capacitor, wherein the voltage on the voltage output line is a measure of noise.

The second plate of the charge accumulation capacitor is preferably connected to a pre-charge line operable to inject a predetermined amount of charge onto the second plate, and wherein, in the noise measurement mode, the second plate of the charge accumulation capacitor is pre-charged before mimicking the signal measurement, thereby to measure noise through its modulation of the amount of charge initially placed on the charge accumulation capacitor by the pre-charge.

The invention provides benefit to single element touch sensor devices, i.e. devices with one or more isolated buttons, as well as to one-dimensional sensors, such as sliders or scroll wheels, and also to two-dimensional sensors, such as alpha-numeric key pad emulators and overlays for displays which thereby provide touch screens.

In some embodiments, the device has a plurality of Y electrodes common to each X electrode. In addition, each Y electrode may have its own charge accumulator capacitor. Alternatively, these could be shared through a multiplexer. In a two-dimensional sensor there may be a plurality of X electrodes, and the X and Y electrodes may be arranged to form a two-dimensional array of coupling capacitors distributed over a touch sensitive panel.

The device may further comprise a data acquisition unit, such as a microcontroller or other processor, connected to the voltage output line and operable to measure the voltage on the voltage output line to acquire the signal and noise measurements. The device may still further comprise a filter operable to perform numerical processing on the signal measurements, wherein the filter is operable having regard to the noise measurements. The filter may be hosted by the data acquisition unit and provide signal processing in advance of the signal measurements being supplied to higher level systems components. Alternatively, the filter may be hosted in a higher level system component, such as a central processing unit or digital signal processor. The filter preferably has configuration settings that are modified depending on the noise measurements, e.g. a bandpass filter may have its bandpass range changed, a slew filter may have its increment/decrement coefficients changed. Moreover, the noise measurement may govern whether the filter is applied, for example if noise levels are measured to be low, then the filter may be deactivated.

BRIEF DESCRIPTION OF THE DRAWINGS

For a better understanding of the invention, and to show how the same may be carried into effect, reference is now made by way of example to the accompanying drawings, in which:

FIG. 1b is an example illustration of a user's finger disposed proximate the sensor of FIG. 1a;

DETAILED DESCRIPTION

Figure 1A:
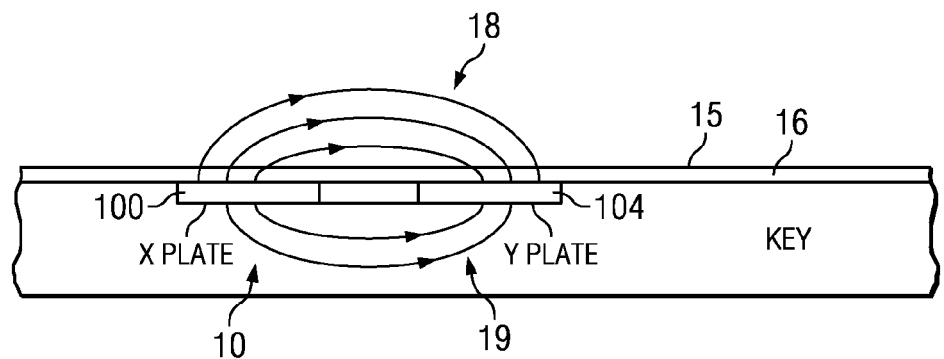
FIG. 1a is a schematic block diagram of a touch sensing node.

FIG. 1a is a schematic cross-section through a touch sensitive control panel 15 in the absence of an actuating body, typically a user's finger or stylus.

Figure 1B:
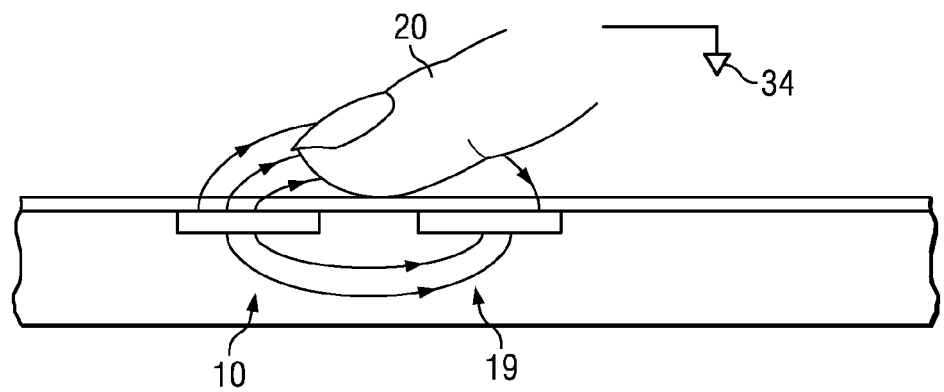

FIG. 1b corresponds to FIG. 1a, but shows the same cross-section in the presence of an actuating body in the form of a user's finger.

The touch sensor shown in FIGS. 1a and 1b corresponds to an example in which a pair of transverse electrodes form a touch sensor. As shown in FIG. 1a a pair of electrodes 100, 104 which form a drive or X plate and a receiving or Y plate in the following description are disposed beneath the surface of a touch sensitive control panel 15. The electrodes 100, 104 are disposed beneath a dielectric layer 16, for example a glass or plastics panel. As shown in FIGS. 1a and 1b the touch sensor 10 is arranged to detect the presence of a body such as a user's finger 20 as a result of a change in an amount of charge transferred from the Y plate 104. As shown in FIG. 1a when the X plate 100 is charged or driven by a circuit, an electric field is formed which is illustrated by the lines 18 and 19 both above and below the touch panel surface 15 as a result of which charge is transferred to the Y plate 104. The X plate and the Y plate 100, 104 form a capacitively chargeable sensing node 10, referred to as a key in the following. As shown in FIG. 1b as a result of the disturbance of the electric field 18 due to the presence of the user's finger 20 the electric field above the surface of the control panel 15 is disturbed as a result of an earthing or grounding effect provided by the user's finger 20 as illustrated schematically by ground 34.

Figure 2:
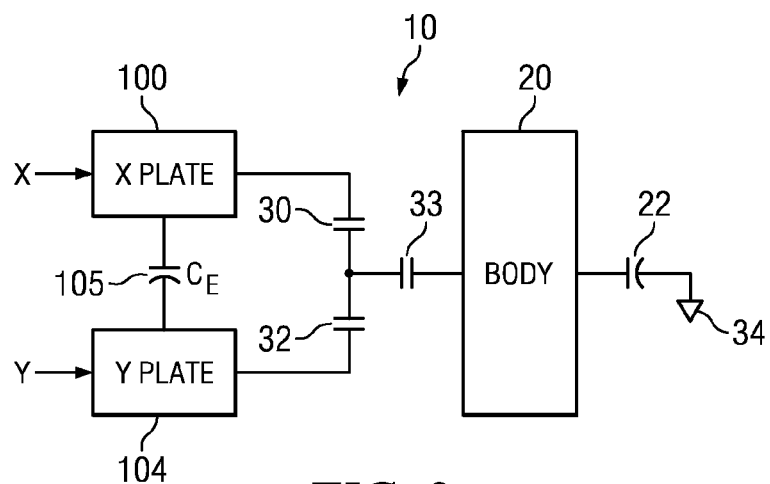
FIG. 2 is a schematic block diagram illustrating an electrical equivalent of the touch sensor shown in FIG. 1b.

An equivalent circuit diagram of the touch sensor shown in FIGS. 1a and 1b is shown in FIG. 2. In FIG. 2 equivalent capacitances are illustrated in the form of a circuit diagram. A capacitance formed between the X plate 100 and the Y plate 104 of the key is a capacitance CE 105 (sometimes also referred to as Cx in the art) which is in effect a coupling capacitor. The presence of the body 20 has an effect of introducing shunting capacitances 30, 32, 33 which are then grounded via the body 20 by an equivalent grounding capacitor 22 to the ground 34. Thus the presence of the body 20 affects the amount of charge transferred from the Y plate of the key and therefore provides a way of detecting the presence of the body 20. This is because the capacitive coupling between the X plate 100 and the Y plate 104 of the key CE 105 reduces as a result of the T-bridge effect caused by the increased capacitance 33.

It will be appreciated by the skilled person that FIGS. 1a and 1b are depicting a so-called active capacitive sensors based on measuring the capacitive coupling between two electrodes (rather than between a single sensing electrode and a system ground). The principles underlying active capacitive sensing techniques are described in U.S. Pat. No. 6,452,514. In an active-type sensor, one electrode, the so called drive electrode, is supplied with an oscillating drive signal. The degree of capacitive coupling of the drive signal to the sense electrode is determined by measuring the amount of charge transferred to the sense electrode by the oscillating drive signal. The amount of charge transferred, i.e. the strength of the signal seen at the sense electrode, is a measure of the capacitive coupling between the electrodes. When there is no pointing object near to the electrodes, the measured signal on the sense electrode has a background or quiescent value. However, when a pointing object, e.g. a user's finger, approaches the electrodes (or more particularly approaches near to the region separating the electrodes), the pointing object acts as a virtual ground and sinks some of the drive signal (charge) from the drive electrode. This acts to reduce the strength of the component of the drive signal coupled to the sense electrode. Thus a decrease in measured signal on the sense electrode is taken to indicate the presence of a pointing object.

Figure 3:
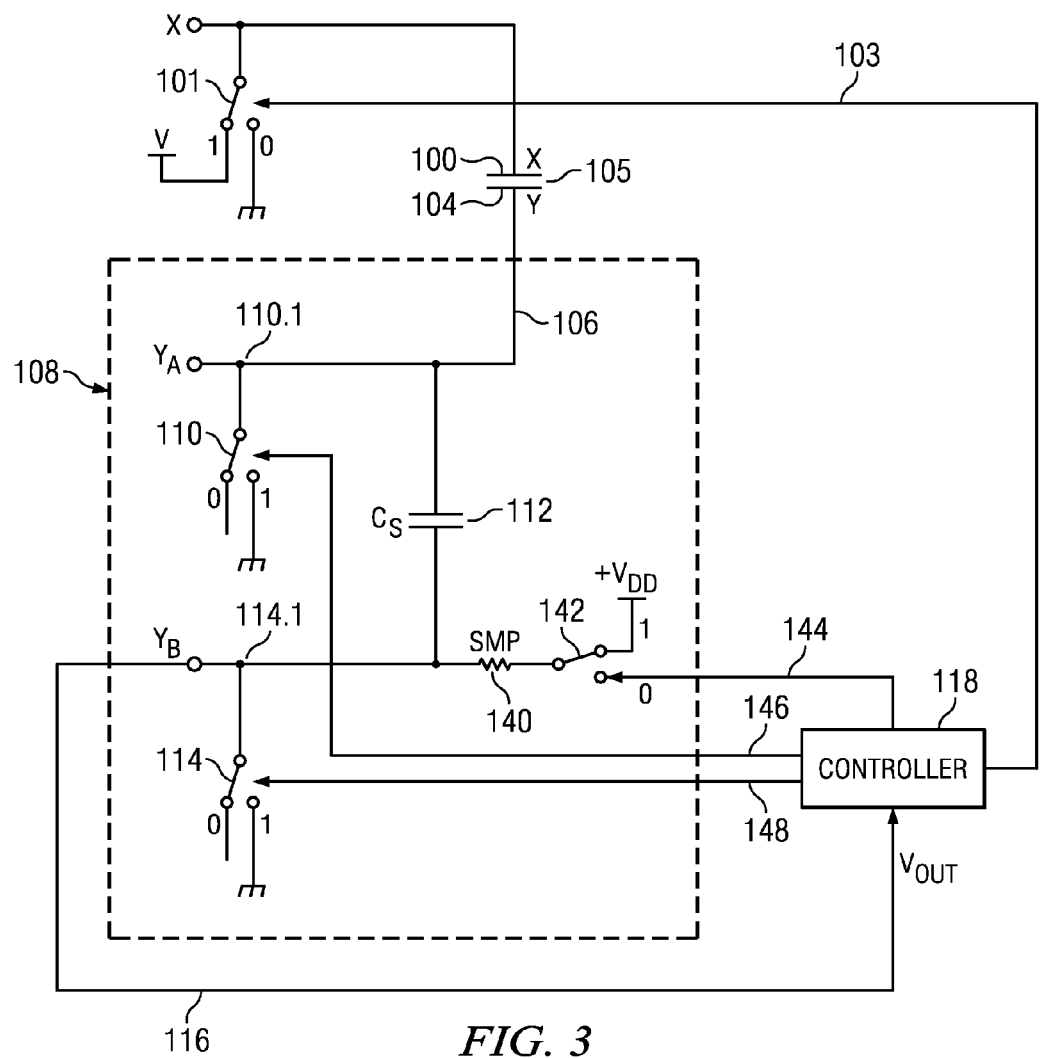
FIG. 3 is a schematic block diagram of a touch sensing circuit for use with the touch sensing node of FIG. 1a and FIG. 1b.

FIG. 3 provides a circuit diagram, which forms a touch sensor by sensing an amount of charge transferred from the X plate 100 shown in FIG. 2 to the Y plate 104 and includes a charge measurement circuit which has been reproduced from WO-00/44018, which corresponds to U.S. Pat. No. 6,452,514.

As shown a drive circuit 101 is connected to the X plate 100 of the key 105 and the Y plate 104 of the key 105 is connected to an input 106 of a charge measurement circuit 108, wherein the X and Y plates collectively form the capacitor 105. The input 106 is connected to a first controllable switch 110 and to one side of a measuring capacitor Cs 112 on which charge is accumulated as a measure of capacitive coupling. The other side of the measurement capacitor 112 is connected via a second controllable switch 114 to an output 116 of the measurement circuit 108 which is fed as a voltage VOUT to a controller 118. A first input control channel 103 is used to control the operation of the drive circuit 101. The first and second controllable switches 110 and 114 are controlled by the controller 118 through respective first and second switch control lines 146 and 148 Similarly, the drive circuit 101 is controlled by the controller 118 through the first input control channel 103.

In the illustrated circuit diagram, a convention has been adopted whereby a control input of each of the switches 110, 114 is open when the control input is "0" and closed when the control input is "1". The other side of each of the switches 110, 114 is connected to ground, so that if the control input is "1" then the connecting input would be connected to ground. A similar convention has been adopted for drive circuit 101, whereby when the control input 103 is "0" the X plate is connected to ground and when the control input is "1" the X plate is connected to a reference voltage "V".

Figure 4:
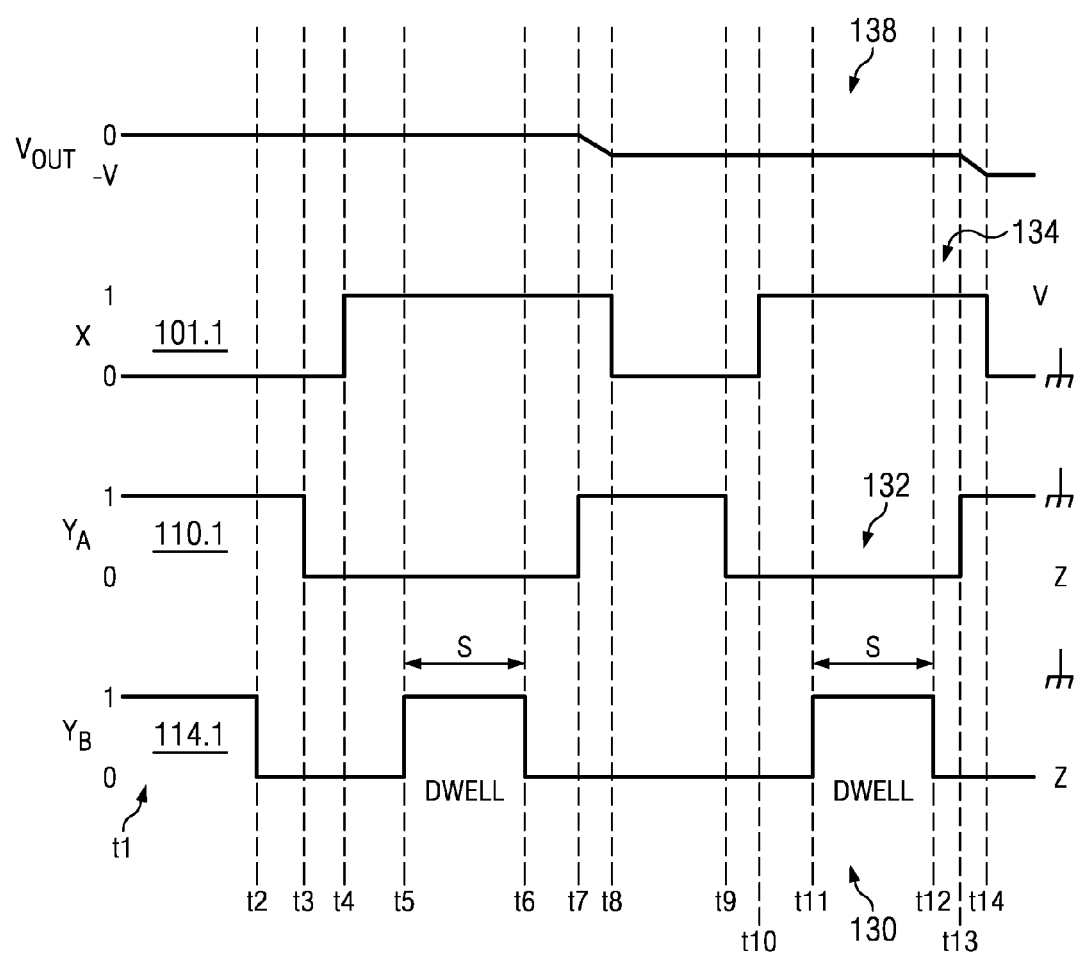
FIG. 4 is an example timing diagram illustrating the operation of the sensing circuit shown in FIG. 3.

FIG. 4 is a timing diagram which shows the operation of the touch sensor, and in particular the function of the measurement circuit arranged to measure the amount of charge transferred from the X plate 100 to the Y plate 104 of the key 105.

Four timing diagrams 130, 132, 134, 138 are shown to illustrate the operation of the measurement circuit 108.

A first timing diagram 130 represents the control input applied to the second switch 114. On the left hand side, the logical value of the control input is shown, whereas on the right hand side the effect at the connecting point 114.1 is shown to be either "Z" in which the connecting point 114.1 is isolated or floating, or for a logical control input of 1 grounded.

A second timing diagram 132 represents the control input applied to the first switch 110. The logical control input values "0" or "1" of a connecting point 110.1 are shown at either floating (Z) or ground (0).

A third timing diagram 134 shows a relative timing of a drive signal provided to the X plate 100 of the key in which case, in contrast to the timing diagrams 130, 132 for the two switches 110, 114, the value of the timing diagram is an absolute value so that the left hand side illustrates that the voltage varies between ground and the reference voltage "V", which is the voltage used to charge the X plate 100.

A fourth timing diagram 138 provides an illustration of the example signal strength or voltage produced on the measurement capacitor 112 as a result of the opening and closing of the switches 110, 114 and the driving of the X plate 100 in accordance with the timing illustrated by the timing diagrams 130, 132, 134. The timing diagrams 130, 132, 134, 138 will now be explained as follows:

At a first time t1, the charge measurement circuit 108 is initialised, i.e. reset, using control lines 146 and 148 for respective switches 110 and 114 being high (1) and control line 103 for drive circuit 101 being low (0). Control lines 146, 148, 103 are lines connected to the controller 118. The Y plate 104, the X plate 100 and the charge measurement capacitor 112 are thus set to ground. Correspondingly, the output voltage across the charge measurement circuit 112 is at zero. It will be appreciated that connections to ground and VDD could be reversed in other embodiments.

At a second time t2 the logical input to the second switch 114 is set low (0), thereby opening the switch and floating the connecting point 114.1.

At a third time t3 the control input to the switch 110 is set low (0), thereby floating the connecting point 110.1, which is YA before, at a time t4 the control input 103 of the drive circuit 101 is set high (1), thereby the X plate 100 of the key 105 is connected to the reference voltage "V". Then, in order to charge the measurement capacitor Cs for a period S between t5 and t6, the control input to the second switch 114 is set high (1), thereby grounding YB to transfer charge induced on the Y plate of the key 105 onto the charge measurement capacitor 112, until time t6, when the control input to the second switch 114 is set low (0), which again floats the connecting point 114.1. After charging the measurement capacitor Cs for a first dwell time between t5 and t6, at t7 the control input to the first switch 110 is set high (1), thereby grounding the connecting point 110.1, which is connected to the other side of the charge measurement capacitor Cs 112. As a result, the voltage across the measurement capacitor can be measured. The amount of charge transferred from the Y plate 104 onto the measurement capacitor Cs 112 during the dwell time between t5 and t6 is represented as the output voltage VOUT.

At time t8 the control input 103 to the drive circuit 101 goes low (0), thereby the X plate 100 of the key 105 is connected to ground which concludes a first measurement cycle.

At time t9 the next measurement cycle of a measurement burst occurs. At t9 the control input to the switch 110 goes low (0) thereby floating YA, before the control input 103 to the drive circuit 101 again goes high (1), thereby connecting the X plate 100 to the reference voltage "V", at time t10. The measurement capacitor 112 is again charged from charge transferred from the Y plate 104 of the key onto the measurement capacitor 112. As with the first burst at point t11 the control input to the switch 114 goes high (1) thereby grounding the point 114.1 and driving charge onto the measurement capacitor until t12, when the control input to the switch 114 goes low, again floating YB. Thus again charge is transferred from the Y plate 104 during the dwell period between t11 and t12, thereby increasing the voltage across the measurement capacitor Cs as represented as the output voltage VOUT. It will be appreciated that in FIG. 4, VOUT is shown with respect to a ground connection at YA, i.e. if point 110.1 is ground.

At t13 the control input to the switch 110 is set high (1) thereby grounding YA and at t14 control input 103 to the drive circuit 101 goes low (0), thereby connecting the X plate 100 of the key 105 to ground which concludes the second measurement cycle. Thus, as with the first measurement cycle, an amount of charge has been transferred from the Y plate, which has then increased the voltage across the measurement capacitor 112, which represents an amount of charge transferred from the Y plate.

After 'n' measurement cycles of a burst, 'n' packets of charge will have been transferred from the Y plate to the measurement capacitor 112 where the charge is accumulated. By bursting in this way the signal from each transfer is averaged on the measurement capacitor 112, so that when it is read out noise reduction has effectively already taken place, as is well known in the art.

The amount of charge on the measurement capacitor 112 is determined with the aid of a resistor 140. One side of the resistor 140 is connected to the measurement capacitor 112 and the other side, labeled SMP, is connected to a controllable discharge switch 142. The discharge switch 142 is connected to receive a control signal from the controller 118 via a control channel 144. The discharge switch 142 floats SMP when in position '0' and connects SMP to a voltage VDD when in position '1'. The float position is selected during measurement, i.e. during the cycles illustrated in FIG. 4, and the VDD position is selected to discharge the measurement capacitor Cs 112 through the discharge resistor 140 after charge accumulation through a number of cycles.

The controller 118 is operable to determine the amount of charge accumulated on the measurement capacitor by measuring the amount of time, e.g. by counting the number of clock periods, it takes for the charge on the measurement capacitor Cs to discharge, i.e. the amount of time for the voltage VOUT to reduce to zero. The number of clock periods can therefore be used to provide a relative signal sample value for the respective measured charge signal. This is preferably achieved using a comparator that compares VOUT to a zero or ground signal, while capacitor Cs is discharged.

Using the same principles of construction and operation, a matrix or grid of touch sensitive switches can be formed to provide a 2DCT sensor. A user can then at a given time select one, or in some cases a plurality of, positions on a sensitive area.

Figure 5:
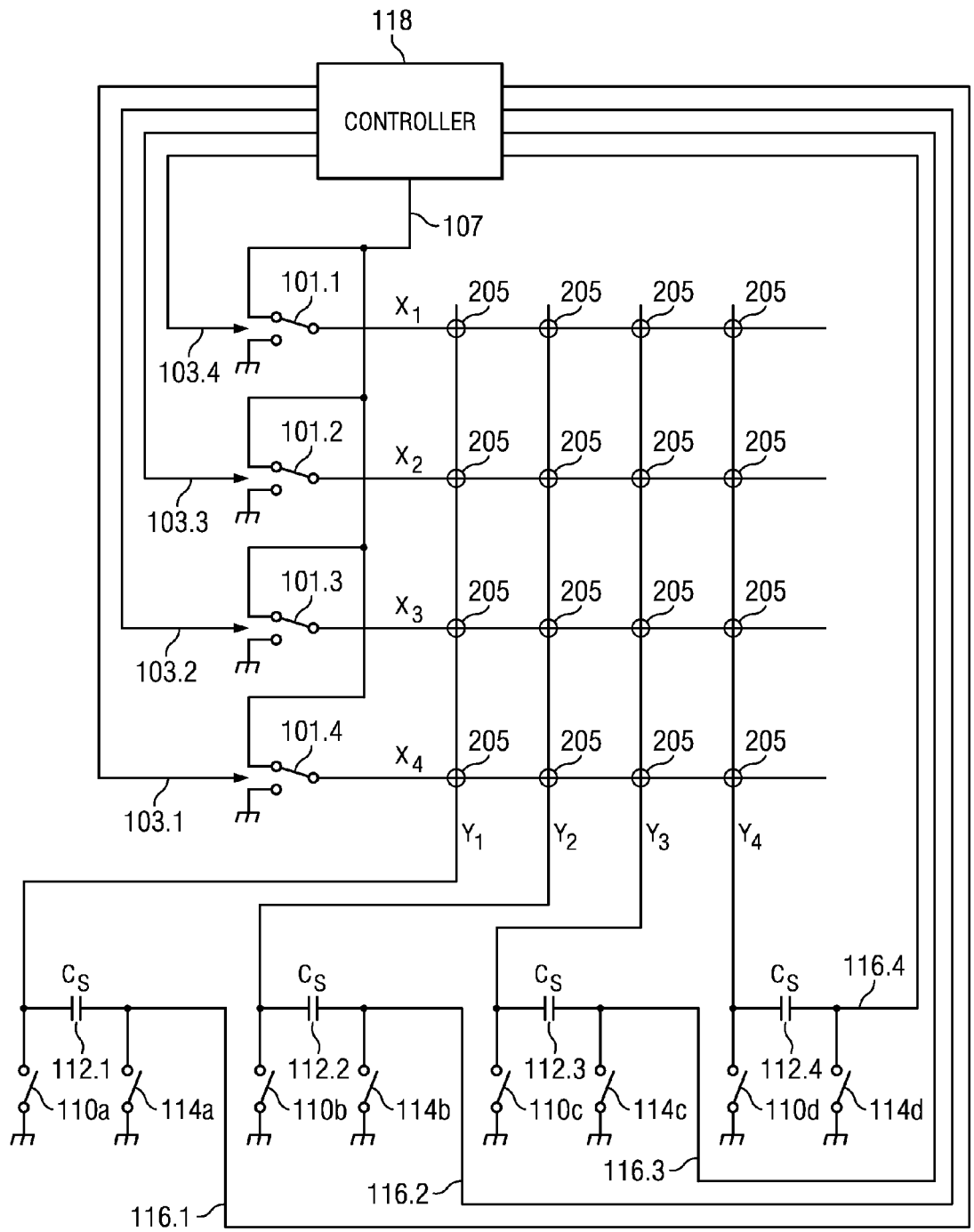
FIG. 5 is a circuit diagram illustrating a touch sensitive matrix providing a two-dimensional capacitive transducing sensor arrangement according to an embodiment of the invention.

FIG. 5 shows a two-dimensional touch sensor employing an array of sensors of the kind described with respect to FIGS. 3 and 4. The charge measurement circuit is used in conjunction with drive circuits 101.1, 101.2, 101.3, 101.4 and is arranged to drive different sensor points 205. As shown each of the drive circuits 101.1, 101.2, 101.3, 101.4 is controlled by the controller 118 to drive each of the corresponding lines X1, X2, X3, X4, using first control inputs 103.1, 103.2, 103.3, 103.4 in the same way as the X plate 100 is driven in FIG. 3 and represented in FIG. 4. Similarly, an input 107 provides a reference voltage "V".

The output of the coupling capacitors at each of the points 205 are connected to one side of measuring capacitors Cs 112.1, 112.2, 112.3, 112.4 which are arranged to measure an amount of charge present on the Y plate, Y1, Y2, Y3, Y4 providing output signals 116.1, 116.2, 116.3, 116.4 to detect the presence of an object in the same way as the operation of the circuit shown in FIG. 3 and FIG. 4. This is achieved by applying control signals to the switches 110a, 110b, 110c, 110d, 114a, 114b, 114c, 114d in a corresponding manner to the arrangement explained above with reference to FIGS. 3 and 4.

In FIG. 5, some of the detail from FIG. 3 has been omitted for clarity. In particular the resistor 140, its switch 142 and actuating line 144 are not shown. It is noted that each of the switches 142 can be commonly actuated by a single actuating line 144 from the controller 118, since they only need to be switched together to perform their function described above.

More details for the operation of such a matrix circuit are disclosed in WO-00/44018.

The controller operates as explained above to detect the presence of an object above one of the matrix of keys 205, from a change in the capacitance of the keys, through a change in an amount of charge induced on the key during a burst of measurement cycles. However, the presence of a noise signal can induce charge onto the keys of a touch sensor and provide a false detection or prevent a detection being made.

Figure 6:
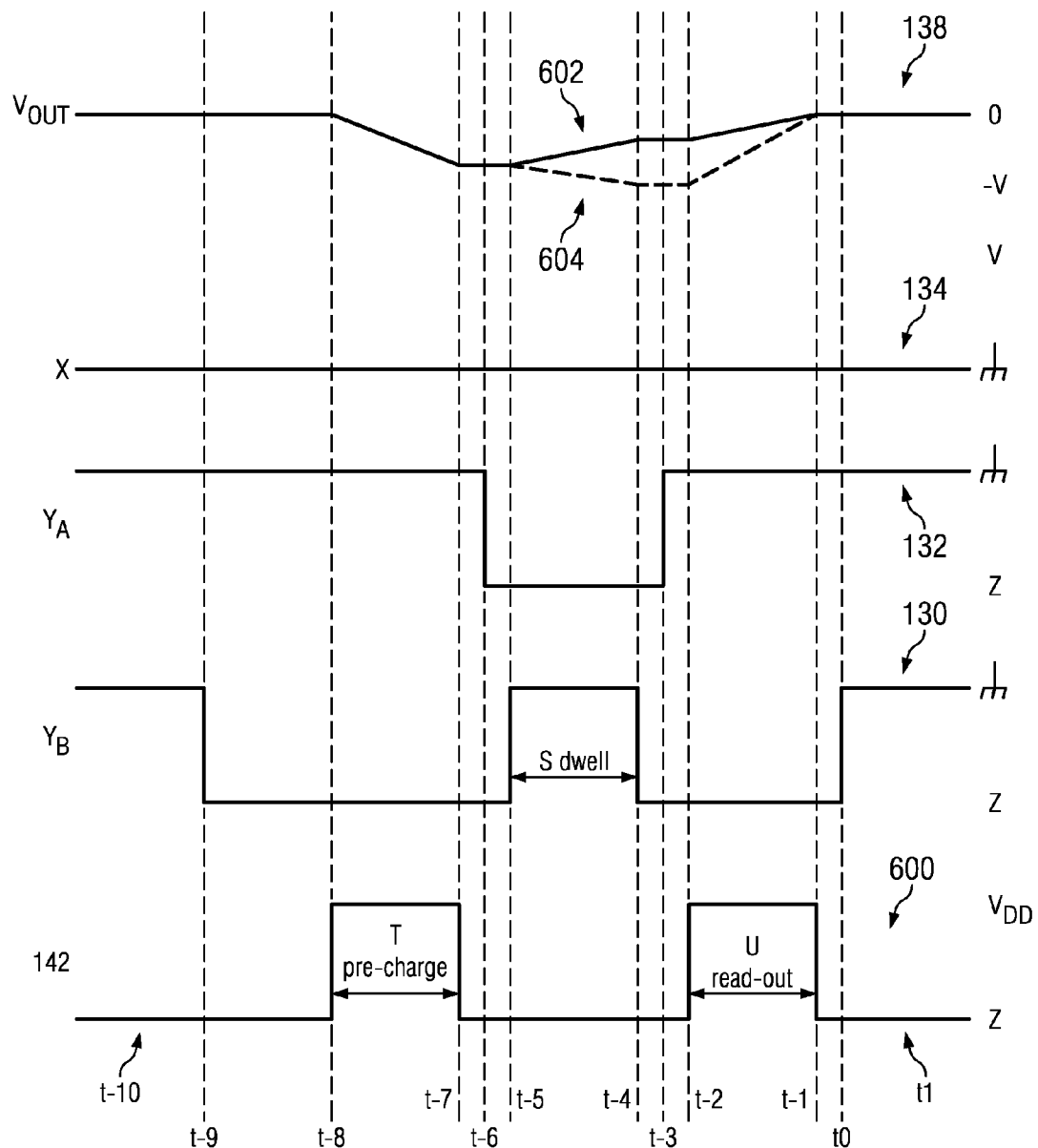
FIG. 6 is a timing diagram illustrating the operation of the sensing circuit shown in FIG. 3 according an embodiment of the invention.
Figure 7:
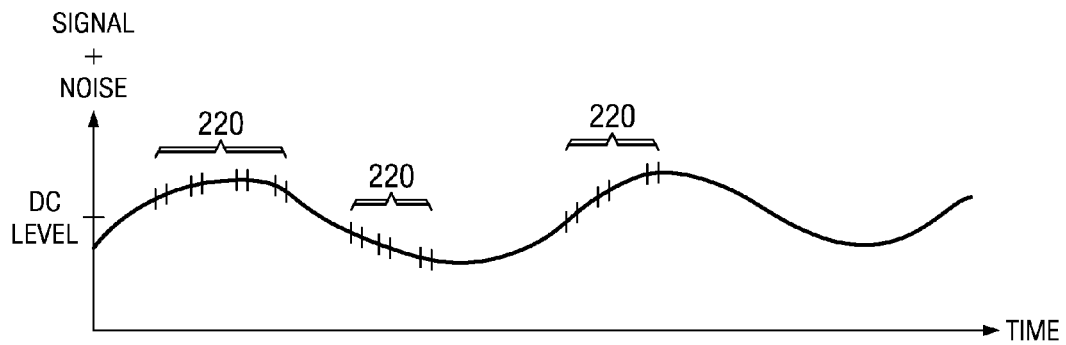
FIG. 7 is a plot of signal strength with respect to time representing a voltage or charge present on a sensing key which has been affected by sinusoidal noise, such as mains noise.
Figure 8:
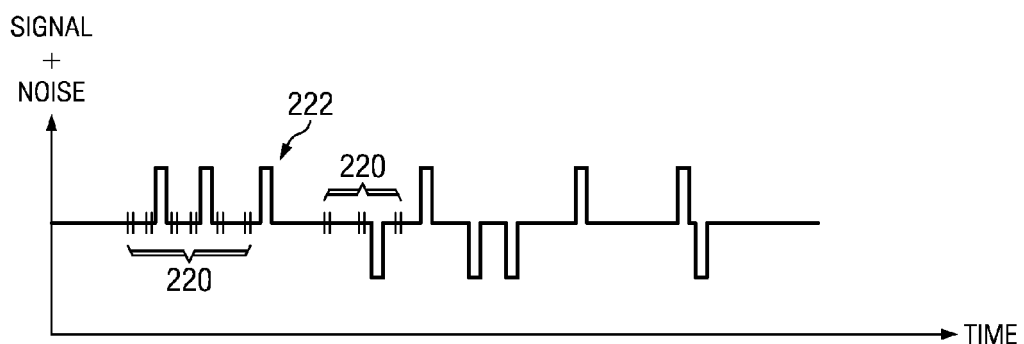
FIG. 8 is a plot of signal strength with respect to time representing the voltage or charge on a sensing key in the presence of rectangular noise, such as LCD noise.
Figure 9:
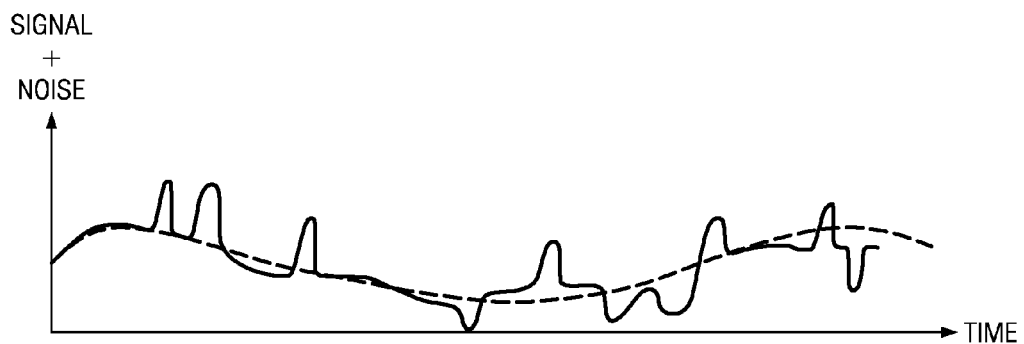
FIG. 9 is a plot of signal strength with respect to time representing the voltage or charge on a sensing key in the presence of sinusoidal and rectangular noise.

FIG. 6 shows timing diagrams 130, 132, 134, 138 and 600 used to illustrate the further operation of the of the measurement circuit 108 shown in FIG. 3 to reduce the effects of noise according to an embodiment of the invention.

The timing diagrams 130, 132, 134 and 138 correspond to the same timing diagrams shown on FIG. 4, except that the timing diagrams shown in FIG. 6 precede those shown in FIG. 4, i.e. they run from t-10 to t1. The same convention for each of the switches 110 and 114 shown in FIGS. 3 and 4 is adopted here. The convention for the switch 142, corresponding to the timing diagram 600, is also shown in FIG. 3. The control signal 144 connects the SMP resistor 140 to either float (Z) or VDD depending on its position which is determined by the control line 144. When the control line 144 is high (1) switch 142 connects SMP resistor 140 to the VDD. When the control line is low (0) switch 142 connects resistor 140 to float (Z).

The timing diagrams 130, 132, 134 and 138 for YB, YA, X and VOUT respectively correspond to those shown in FIG. 4 and described above. Timing diagram 600 represents the control input applied to the switch 142. On the left hand side, the logical value of the control input is shown, whereas on the right hand side the effect at the SMP resistor 140 is shown to be either "VDD" in which the resistor 142 is connected to VDD or float (Z) in which the resistor 142 is floated. The timing diagrams 130, 132, 134, 138 and 600 will now be described.

In FIG. 6 at a first time t-10, the charge measurement circuit 108 is initialized with both the control inputs for the switches 110, 114 being high (1) so that both the Y plate and the charge measurement capacitor 112 are set to ground and the input to the switch 142 is set low (0) so that the resistor 140 is floated. This is to discharge the capacitor.

At time t-9, the logical input to the control switch 114 is set to zero, thereby opening the switch and floating the connecting point 114.1 which connects the output voltage 116 to one side of the measurement capacitor Cs 112.

At a next time t-8 the control input to the switch 142 is set to high (1), thereby connecting the resistor 140 to VDD. The measurement capacitor Cs 112 is now connected to ground at one side and to VDD via the SMP resistor 140 on the other side, thereby charging the capacitor. The measurement capacitor Cs 112 is charged for a predetermined time T to charge Cs by a set amount. This direct charging of the measurement capacitor Cs bypassing the X drive circuit 101 is referred to as a pre-charging. The pre-charge on the capacitor can be calculated, since the voltage, the value of the capacitor Cs 112, the value of the resistor 140 and the charge time T are all known. VOUT 138 shows the voltage of the capacitor between t-8 and t-7.

At time t-7 the control input to the switch 142 is set low (0) thereby floating the SMP resistor 140. At time t-6 the control input to switch 110 is set low (0) thereby point 110.1 is floating.

To measure the amount of noise on the coupling capacitor, switches 110, 114 and 142 are driven in the same way as if they were collecting signal measurements, i.e. the same way as described with reference to FIG. 4, with the exception that the X drive circuit 101 is not driven. Namely, as can be seen from FIG. 6, the control switch to the X plate remains low (0) from time t-10 to t1, so no voltage is applied to the X plate 100 of the coupling capacitor 105. As a result, the charge accumulated on the measurement capacitor 112 is the pre-charge modulated by packets of charge picked up on the Y plate 104 of the coupling capacitor 105 during the acquisition cycles. This modulation will be a measure of noise, since it can only have been noise that has induced charge on the coupling capacitor 105, given the absence of X drive signal during the dwell times of each cycle.

To summarize, a noise measurement is made by mimicking the signal measurement, but without driving the X plate 100. Moreover, by pre-charging the accumulation capacitor before mimicking a normal signal measurement without driving the X plate, noise is measured through its modulation of the amount of charge initially placed on the charge accumulation capacitor by the pre-charge.

In order to charge or discharge the measurement capacitor Cs for a period S between t-5 and t-4, the control input to the switch 114 is set high (1) thereby grounding YB to transfer charge induced on the Y plate 104 of the key 105, due to noise, onto the charge measurement capacitor 112, until t-4 when the control input to the switch 114 is set to low (0), which again floats the connecting point 114.1. During time t-5 to t-4 noise is accumulated on the capacitor Cs as shown on VOUT 138. The noise accumulated on the capacitor Cs during the dwell time could result in the voltage at time t-4 being higher or lower than the voltage at time t-5. Two different outcomes are illustrated in FIG. 6 for VOUT 138 at time t-4. These are illustrated as solid line 602, between times t-5 and t-1 and dotted line 604 between time t-5 and t-1. The solid line 602 illustrates a noise signal that has removed charge from the measurement capacitor Cs and the dotted line 604 illustrates a noise signal that has added charge to the measurement capacitor Cs.

After charging the measurement capacitor Cs for a first dwell time S between t-5 and t-4, at t-3 the control input to switch 110 is set high (1), thereby grounding the connecting point 110.1 (YA), which is connected to the other side of the charge measurement capacitor Cs 112. This will allow the charge on the capacitor Cs to be measured.

The measurement of the charge accumulated on capacitor Cs is carried out in the same manner as described above for measuring the charge accumulated on the capacitor due to a touch. At time t-2 the control input 144 to switch 142 goes high (1), thereby connecting the SMP resistor to VDD. As a result, the voltage across the measurement capacitor Cs 112 can be measured between times t-2 and t-1. The amount of charge transferred from the Y plate 104 onto the measurement capacitor Cs 112 during the dwell time between t-5 and t-4 in addition to the pre-charged charge on the measurement capacitor is measured using the method described above. The read-out time U is used to determine the amount of charge on the capacitor Cs, in addition to the capacitance of the capacitor Cs, which is known.

It will be appreciated that the read-out time for each of the two outcomes represented by the solid line 602 and the dotted line 604 will be different i.e. the time to discharge the measurement capacitor Cs for the scenario illustrated by the dotted line 604 will be higher than for the scenario represented by the solid line 602. However, for simplicity these have been shown having the same read-out time in FIG. 6.

At time t0 the control switch 114 is set high (1) so that the timing diagram continues on to time t1 as shown in FIG. 3. The control input for switch 142 is held low (0) during the measurement of the charge on the Y plate while the X plate is driven, as described above.

The process above is only described for a single charge measurement circuit. However, it will be appreciated that the process described above could be carried out on each of the Y plates using each of the charge measurement circuits connected to the Y plates as shown in FIG. 5.

In the above example, the noise acquisition precedes the signal acquisition. However, the time sequence is arbitrary. In practice, the measurements will be interspersed, with for example one noise sample being taken followed by several signal samples and then another noise sample etc.

Once the charge on the measurement capacitor Cs due to noise on the Y plate is measured, the amount of noise is determined. The detected noise is the difference between the charge on the measurement capacitor from the pre-charge cycle and the measured charge on the measurement capacitor after the dwell time. It will be appreciated that the charge on the capacitor after the dwell time could be less than or equal to the pre-charge charge, since charge can be removed from the capacitor as a result of the noise as well as being added. In other words the noise is a charge value that is obtained from subtracting the amount of charge on the measurement capacitor Cs 112 after the pre-charge step from the measured charge on the measurement capacitor Cs 112 after the dwell time. "Noise charge" will be used to identify this charge difference.

A noise factor is now calculated using the calculated noise charge. To calculate the noise factor, the detected noise charge from the current sample and the previous four samples are used. The standard deviation of these 5 samples is calculated. This will be referred to as the noise factor. It will be appreciated that it is computationally intensive to calculate a square root, so in the preferred embodiment the square of the standard deviation is used. It will be appreciated that more or less samples could be used to obtain the noise factor. Furthermore, it will be appreciated that other methods method for averaging the noise charge could be used.

The method described above has shown how a noise factor can be calculated using the touch sensor and touch matrix shown in FIGS. 3 and 5. Examples of how the noise factor is used to reduce the effects of noise in such an arrangement shown in FIGS. 3 and 5 are now described.

In an embodiment of the invention the controller 118 contains a single filter. The filter could be any type of linear or non-linear filter, for example a low pass filter. The noise factor is used to control whether or not the filter is used. If the noise factor is below a specified threshold the filter is not used. However, if the noise factor is above a specified threshold the filter is applied to the measured signals. For example, if the touch matrix was implemented in a mobile phone, the noise factor during normal operation may fall below the specified value, thereby no filtering is used. However, if the mobile phone is connected to a phone charger during operation, for example, the phone charger may introduce noise. Therefore, if the noise factor due to the phone charger exceeds the specified value the filter would be applied to the measured signal. Once the phone battery is charged and the phone is disconnected from the charger the noise factor will again be below the specified value and the filter will not be applied to the measured signal The embodiment of the invention provides a method for configuring one or more filters in response to real time noise signals present on the touch matrix. The sensing hardware shown in FIGS. 3 and 5 typically remains unchanged. Therefore this may be implemented as a firmware update. Since, the method described above provides a method for activating or deactivating filters, when there is no noise source or the noise source is low i.e. below a specified value, the time taken to determine the location of a touch on a touch matrix can be increased, since there is no requirement for filtering.

In another embodiment the controller 118 may contain a low pass filter that can be configured using the acquired noise factor using the method described above. The frequency pass of the filter may be adjusted based on the amount of noise detected. For example, if the expected signal level detected on the touch matrix is 'S', the frequency pass of the filter during normal operation could be 'S'+10. However, if the detected noise signal is very high for example, then the frequency pass of the filter band could be increased to accommodate a signal with a greater amount of noise. Alternatively, the low pass filter could be replaced with a slew rate limiter. The rate at which the input value is allowed to change is adapted in accordance with the noise factor. If the noise factor is high, the slew rate limiter is adapted to allow signals that change more slowly, i.e. the allowed slew rate is low. Alternatively, if the noise factor is low, the slew rate limiter is adapted to allow signals that change more quickly, i.e. the allow slew rate is high.

It will be appreciated that other types of slew rate limiter could be used other than a linear changing slew filter. For example where two consecutive samples exceed a predetermined value, the rate of change can be capped to a fixed increment or decrement so that the slew rate limiter can settle on the average value more quickly.

In summary of the above-described embodiments, a capacitive touch sensor is provided for detecting proximity and location of a body, the sensor comprising: one or multiple X lines; a plurality of Y lines each arranged to have a portion thereof adjacent to a portion of each of the X lines to form a plurality of sensing capacitors; a charge measurement capacitor connected to each Y line; one or more drive circuits arranged to drive respective ones of the X lines to enable charge transfer from the sensing capacitors associated with that X line to the respective measurement capacitors connected to the Y lines. The touch sensor is operable under control of a controller to measure a signal value in the usual way from one of the measurement capacitors, the signal value being indicative of the amount of charge transferred from one of the plurality of Y lines when actuating one of the respective X lines. The touch sensor is further operable under control of a controller to measure a noise value from one of the measurement capacitors indicative of the amount of charge transferred from one of the plurality of Y lines without first actuating one of the respective X lines. Charge is preferably injected onto the charge measurement capacitor before measuring the noise value, so that any noise contribution is accurately measured.

What is claimed is:

1. A method comprising:
  grounding a first plate of a charge-accumulation capacitor;
  injecting, through a resistor coupled to a voltage source, a predetermined amount of charge onto a charge-measurement capacitor;
  transferring an amount of charge accumulated on a second plate of the charge-accumulation capacitor to a first plate of the charge-measurement capacitor, the charge having accumulated on the second plate of the charge-accumulation capacitor due at least in part to noise; and
  determining, through a measured voltage across the charge-measurement capacitor, the amount of charge.

2. The method of claim 1, further comprising calculating a noise factor to configure a filter based on the determined amount of charge.

3. The method of claim 1, further comprising if the calculated noise factor is above a specified threshold value, then applying the configured filter to perform a numerical process on a measured signal.

4. An apparatus comprising:
  a charge-measurement capacitor having a second plate coupled to a first plate of a charge-accumulation capacitor; and
  one or more non-transitory computer-readable storage media embodying logic that is operable when executed to:
  ground the first plate of the charge-accumulation capacitor;
  inject a predetermined amount of charge onto the charge-measurement capacitor through a resistor coupled to a voltage source;
  transfer an amount of charge accumulated on a second plate of the charge-accumulation capacitor to a first plate of the charge-measurement-capacitor, the charge having accumulated on the second plate of the charge-accumulations capacitor due at least in part to noise; and
  determine, through a measured voltage across the charge-measurement capacitor, the amount of charge.

5. The apparatus of claim 4, wherein the logic is further operable when executed to calculate a noise factor to configure a filter based on the determined amount of charge due to noise.

6. The apparatus of claim 5, wherein the logic when executed is further operable to apply the configured filter to perform a numerical process on a measured signal, if the calculated noise factor is above a specified value.

7. The apparatus of claim 4, wherein injecting the predetermined amount of charge further comprises coupling the second plate of the charge-measurement capacitor to the voltage source for a predetermined amount of time.

8. The apparatus of claim 4, wherein the logic is further operable when executed to determine the amount of charge by measuring an amount of time to reduce the measured voltage across the charge-measurement capacitor to ground.

9. The apparatus of claim 8, wherein the logic is further operable when executed to determine the amount of time by counting a number of clock periods for the measured voltage across the charge-measurement capacitor to become ground.

10. A non-transitory computer-readable storage media embodying logic that is operable when executed to:
  ground a first plate of a charge-accumulation capacitor;
  inject, through a resistor coupled to a voltage source, a predetermined amount of charge onto a charge-measurement capacitor;
  transfer an amount of charge on a second plate of the charge-accumulation capacitor to a first plate of the charge-measurement capacitor, the charge having accumulated on the second plate of the charge-accumulation capacitor at least in part due to noise; and determine, through a measured voltage across the charge-measurement capacitor, the amount of charge.

11. The media of claim 10, wherein the logic is further operable when executed to calculate a noise factor to configure a filter based on the determined amount of charge.

12. The media of claim 11, wherein the logic is further operable when executed to apply the configured filter to a numerical process on a measured signal, if the calculated noise factor is above a specified value.

13. The media of claim 10, wherein injecting the predetermined amount of charge further comprises coupling the second plate of the charge-measurement capacitor to the voltage source for a predetermined amount of time.

14. The media of claim 10, wherein the logic is further operable when executed to determine the amount of charge by measuring an amount of time to reduce the measured voltage across the charge-measurement capacitor to ground.

15. The media of claim 14, wherein the logic is further operable when executed to determine the amount of time by counting a number of clock periods for the measured voltage across the charge-measurement capacitor to become ground.

16. The method of claim 1, wherein injecting the predetermined amount of charge further comprises coupling the second plate of the charge-measurement capacitor to the voltage source for a predetermined amount of time.

17. The method of claim 1, wherein determining the amount of charge further comprises measuring an amount of time to reduce the measured voltage across the charge-measurement capacitor to ground.

18. The method of claim 17, wherein determining the amount of time further comprises counting a number of clock periods for the measured voltage across the charge-measurement capacitor to become ground.

* * * * *